United States Patent
Kanaya

(10) Patent No.: US 10,372,003 B2
(45) Date of Patent: Aug. 6, 2019

(54) DISPLAY DEVICE AND WIRING STRUCTURE

(71) Applicant: Japan Display Inc., Minato-ku (JP)

(72) Inventor: Yasuhiro Kanaya, Tokyo (JP)

(73) Assignee: Japan Display Inc., Minato-ku (JP)

( * ) Notice: Subject to any disclaimer, the term of this patent is extended or adjusted under 35 U.S.C. 154(b) by 5 days.

(21) Appl. No.: 15/782,930

(22) Filed: Oct. 13, 2017

(65) Prior Publication Data

US 2018/0120658 A1 May 3, 2018

(30) Foreign Application Priority Data

Oct. 28, 2016 (JP) .................. 2016-211427

(51) Int. Cl.

| | | |
|---|---|---|
| G02F 1/136 | (2006.01) | |
| G02F 1/1362 | (2006.01) | |
| G02F 1/1335 | (2006.01) | |
| G02F 1/1343 | (2006.01) | |
| H01L 21/768 | (2006.01) | |
| G02F 1/1333 | (2006.01) | |

(52) U.S. Cl.
CPC .... *G02F 1/136286* (2013.01); *G02F 1/13624* (2013.01); *G02F 1/133514* (2013.01); *G02F 1/134309* (2013.01); *G02F 1/136227* (2013.01); *H01L 21/76804* (2013.01); *G02F 1/133345* (2013.01)

(58) Field of Classification Search
CPC ......... G02F 1/136227; G02F 1/136286; G02F 1/133555; G02F 1/13458; G02F 1/134309; G02F 2001/13685
See application file for complete search history.

(56) References Cited

U.S. PATENT DOCUMENTS

| | | | | |
|---|---|---|---|---|
| 5,585,951 | A * | 12/1996 | Noda ................ | G02F 1/136227 349/122 |
| 6,136,624 | A | 10/2000 | Kemmochi et al. | |
| 6,252,297 | B1 | 6/2001 | Kemmochi et al. | |
| 2002/0019082 | A1* | 2/2002 | Wong ................ | H01L 29/66765 438/149 |
| 2013/0229609 | A1* | 9/2013 | Jeong ................ | G02F 1/133707 349/138 |

FOREIGN PATENT DOCUMENTS

JP          10-307305          11/1998

* cited by examiner

*Primary Examiner* — James A Dudek
(74) *Attorney, Agent, or Firm* — Oblon, McClelland, Maier & Neustadt, L.L.P.

(57) ABSTRACT

According to one embodiment, a display device includes a first substrate including a semiconductor layer, a first inorganic insulating film provided above the semiconductor layer and including a first opening, an organic insulating film provided above the semiconductor layer and including a second opening in a region which overlaps the first opening, a metal film stacked on the semiconductor layer and a pixel electrode provided in the first opening and the second opening to be in contact with the metal film and the semiconductor layer, and the metal film is spaced from a first side surface of the first opening and a second side surface of the second opening.

15 Claims, 13 Drawing Sheets

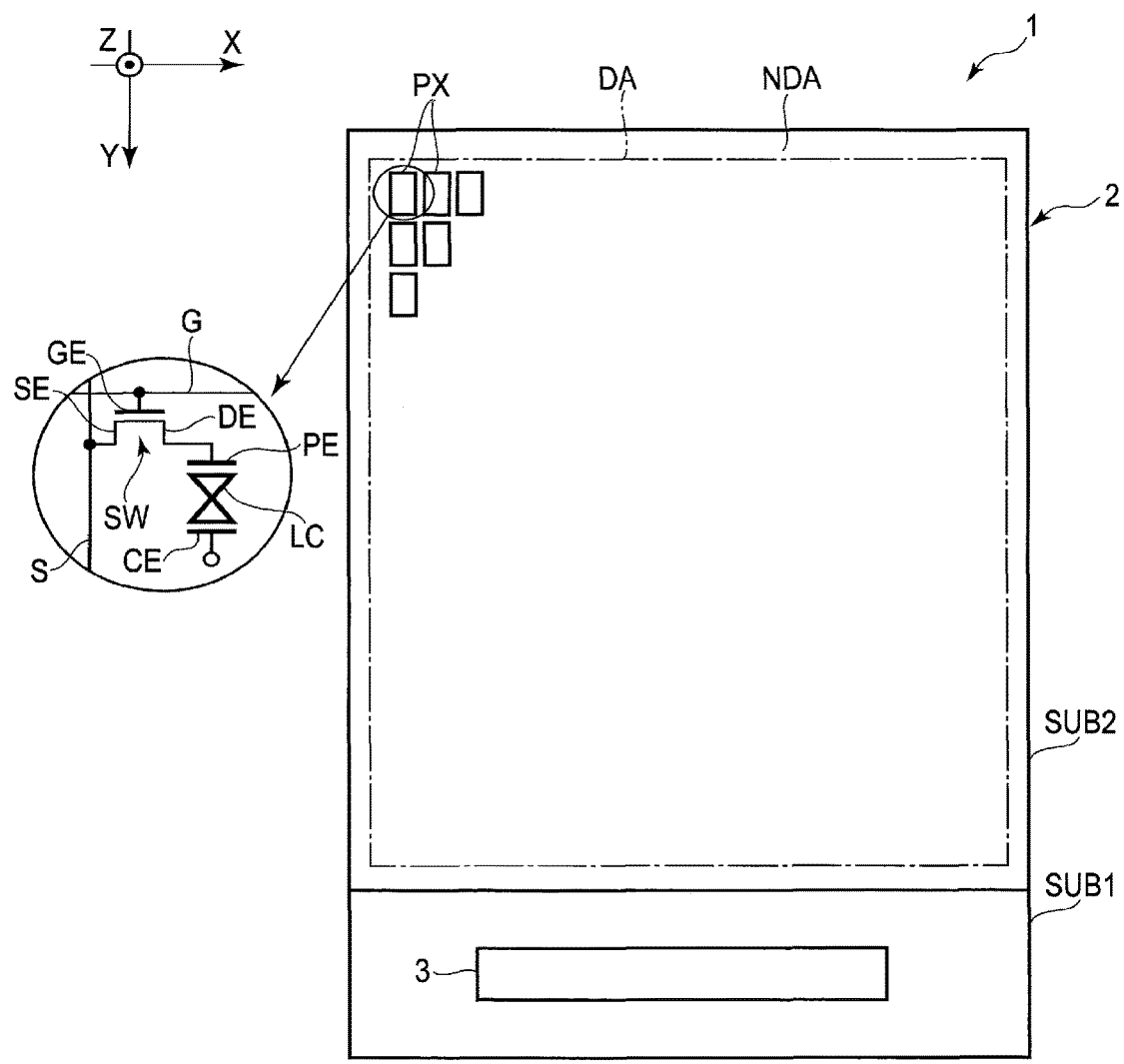
F I G. 1

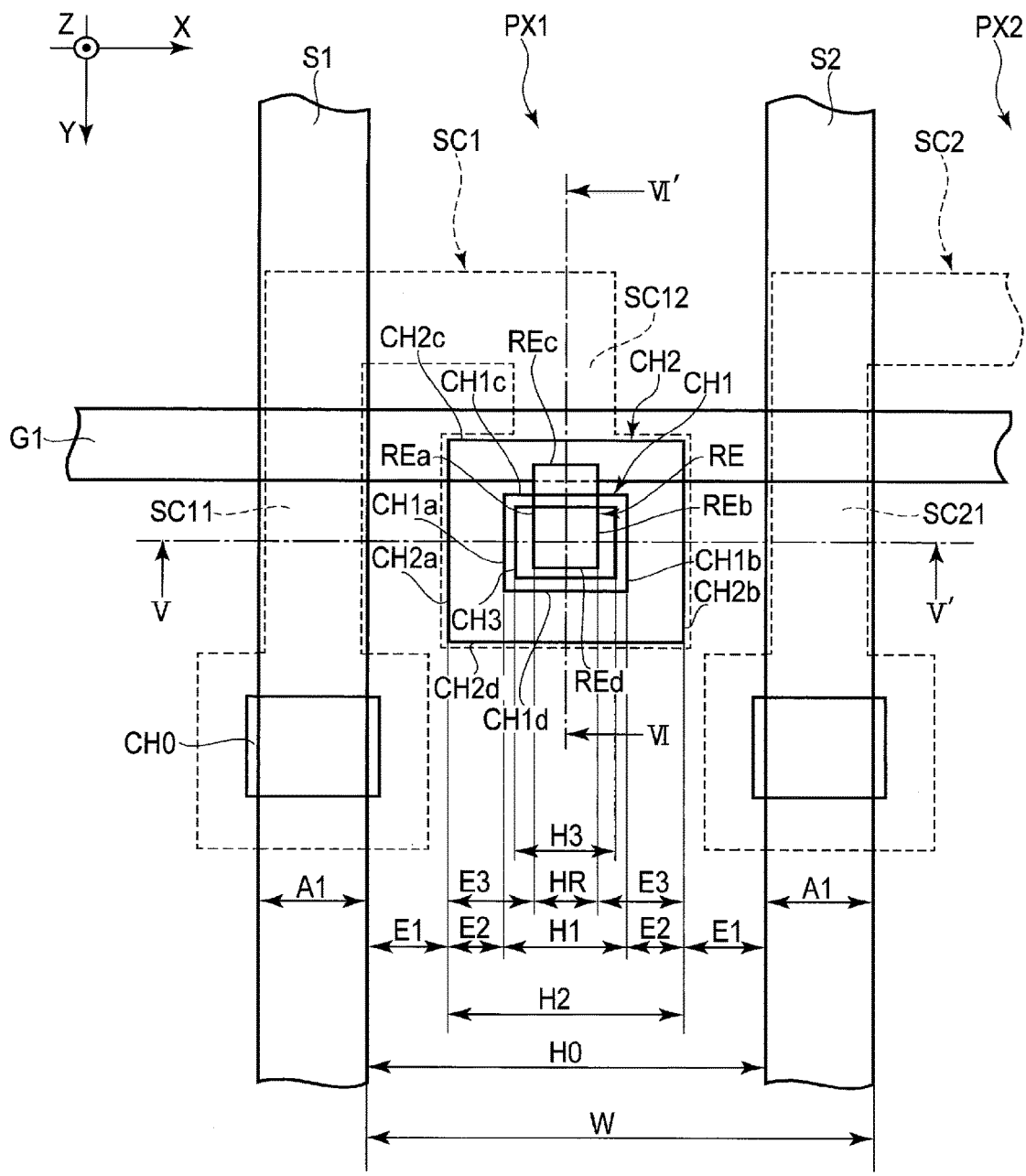
F I G. 3

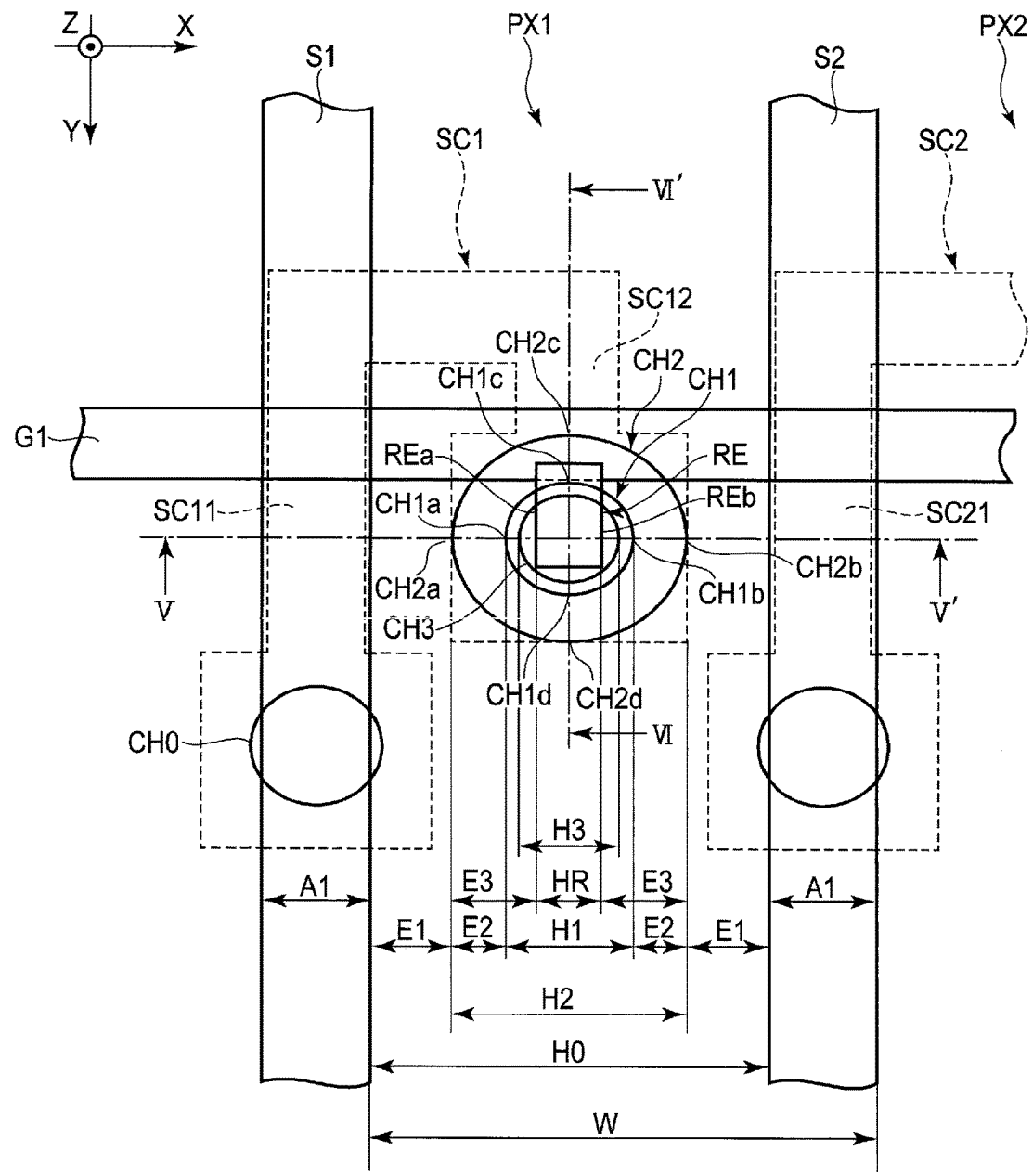
F I G. 4

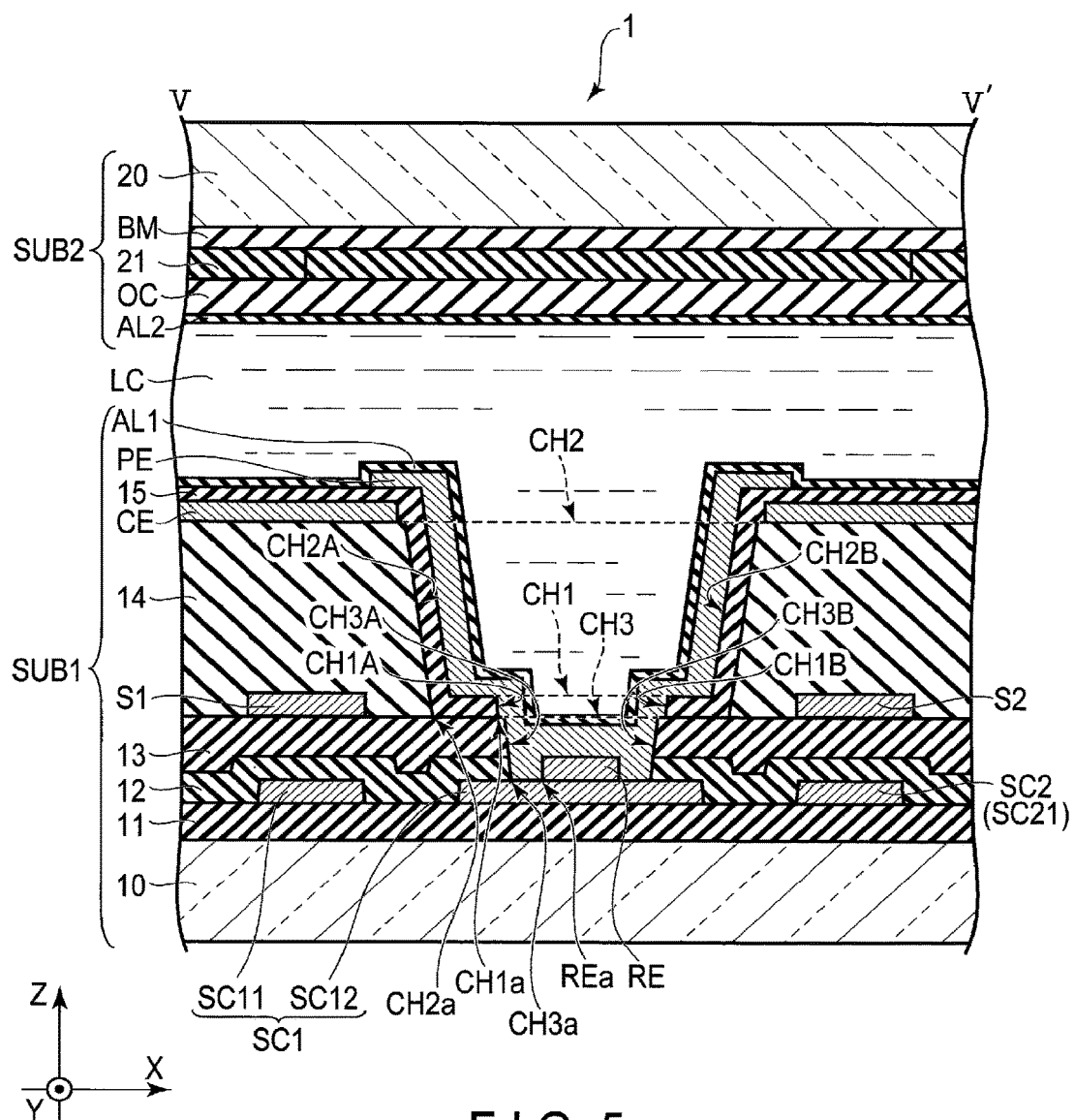
F I G. 5

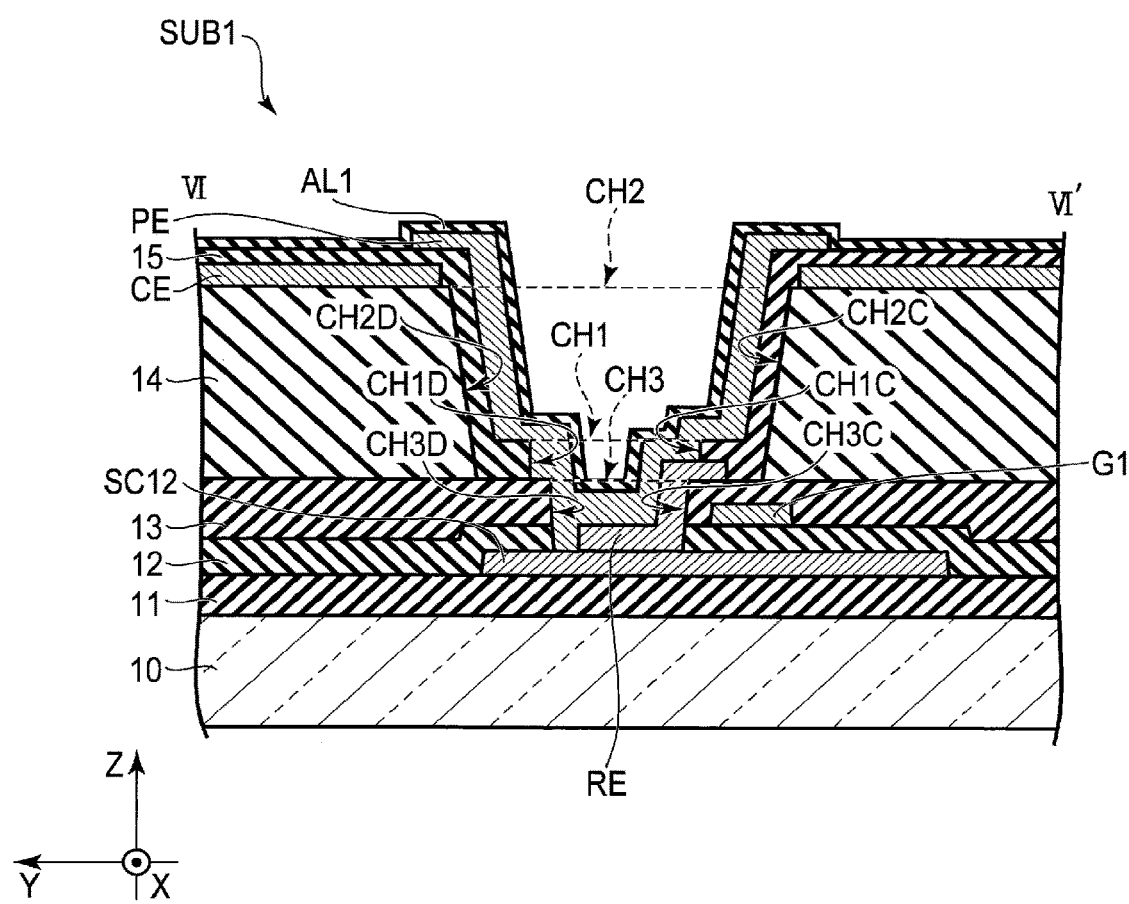
F I G. 6

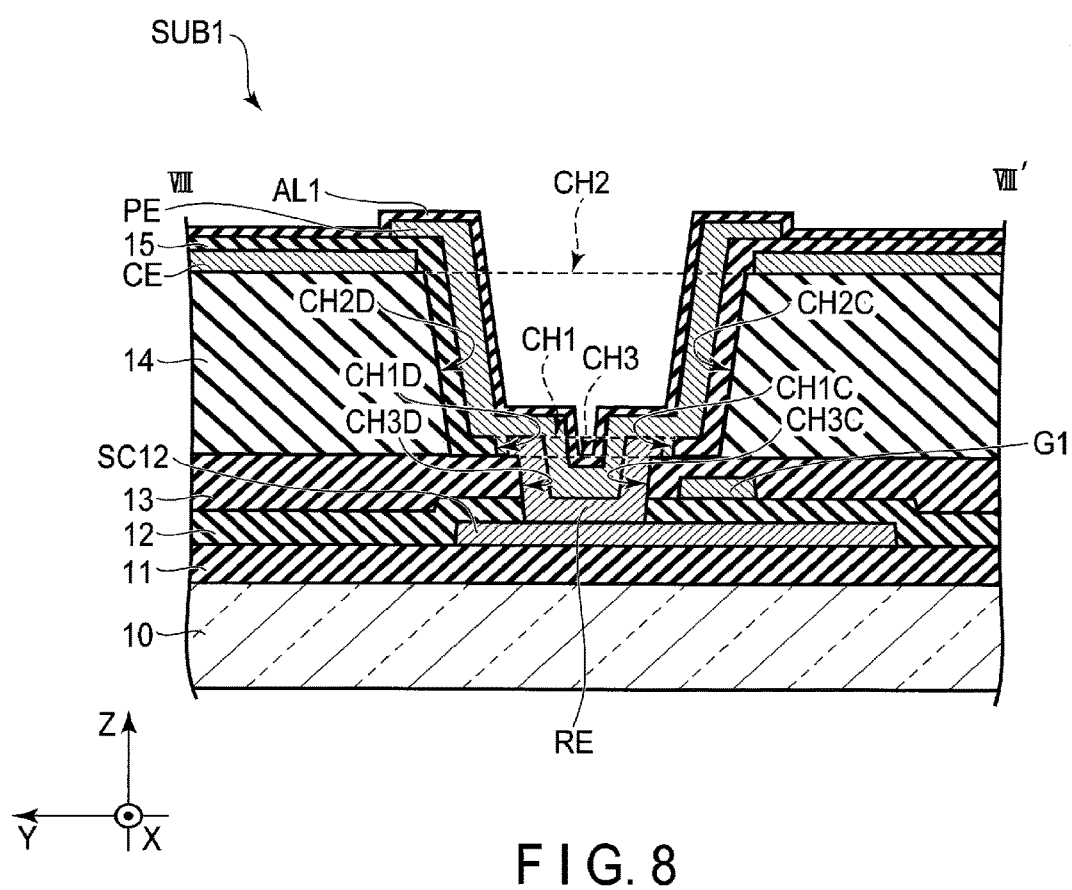
F I G. 8

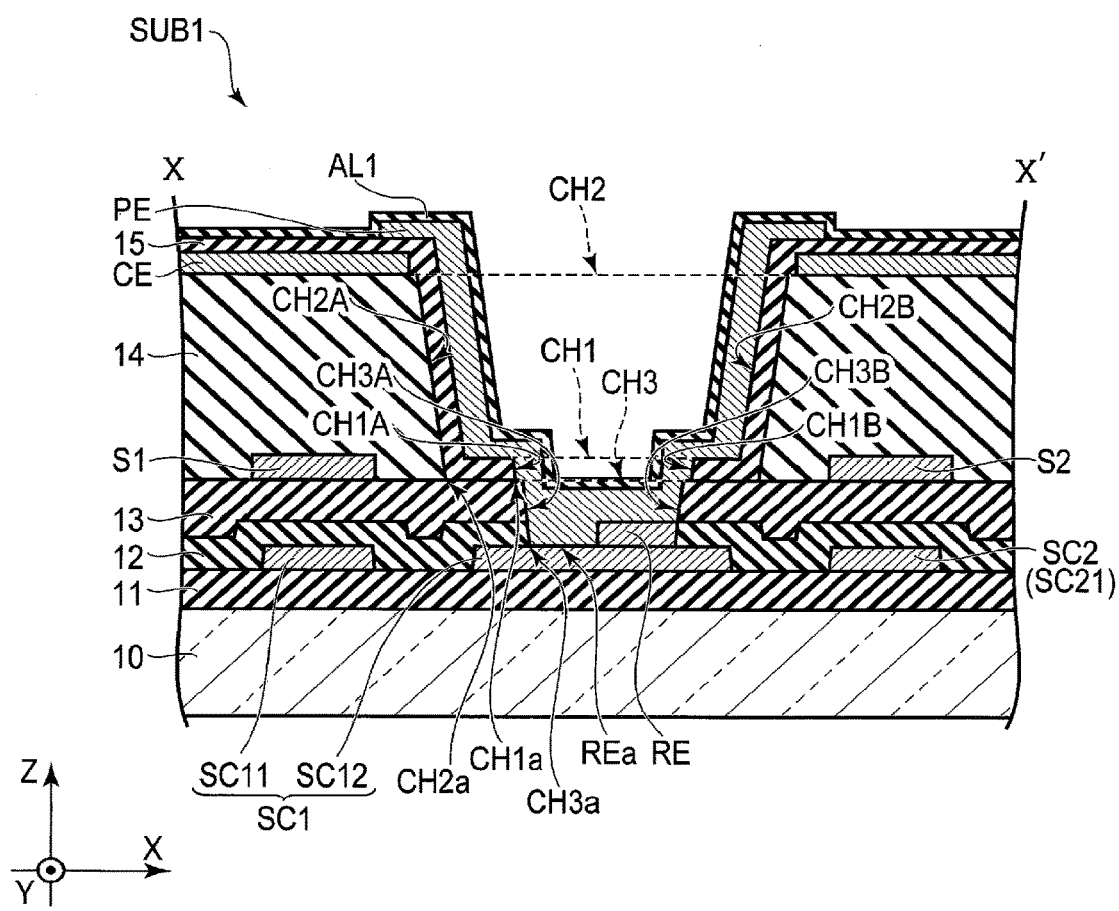
F I G. 10

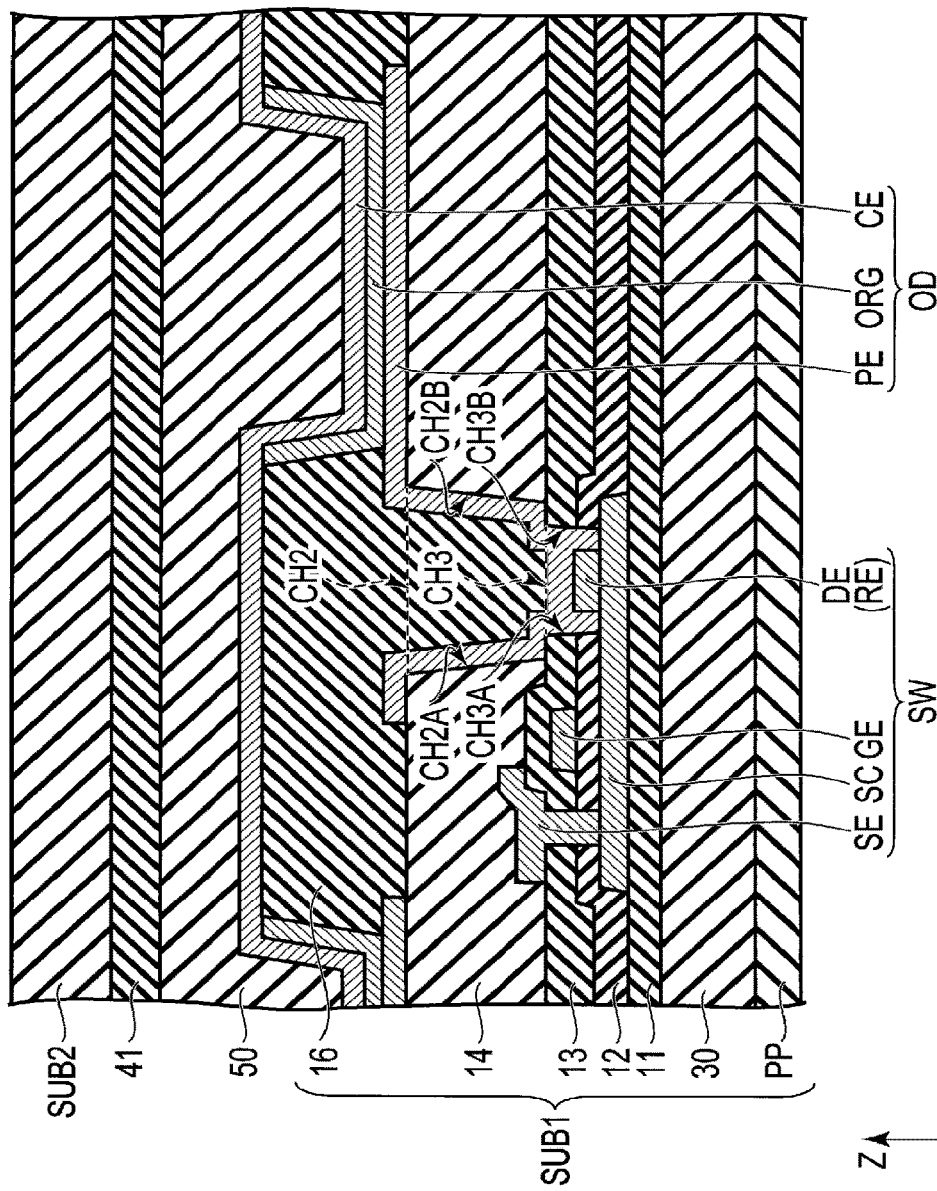
F I G. 13

DISPLAY DEVICE AND WIRING STRUCTURE

CROSS-REFERENCE TO RELATED APPLICATIONS

This application is based upon and claims the benefit of priority from Japanese Patent Application No. 2016-211427, filed Oct. 28, 2016, the entire contents of which are incorporated herein by reference.

FIELD

Embodiments described herein relate generally to a display device and a wiring substrate.

BACKGROUND

Active-matrix type display devices comprising a plurality of pixels include a wiring substrate on which switching elements for driving the pixels are formed. The switching elements are each formed from, for example, a thin film transistor. Such a display device, in some cases, comprises a contact hole formed therein to connect an electrode of a switching element to another conductive material formed in a different layer on the wiring substrate.

On the other hand, in the same layer where the electrode of the switching element is formed, it is necessary to provide a space (margin) between the electrode of the switching element and other conductive materials in order to avoid the electrode of the switching element from contacting the other conductive materials.

In recent years, as the definition of display devices is increased, the width of the pixels tends to decrease. Therefore, the ratio between the width of the electrode and the margin in a pixel is becoming unneglectable.

BRIEF DESCRIPTION OF THE DRAWINGS

FIG. 1 is a plan view schematically showing a display device of a first embodiment.

FIG. 3 is an enlarged plan view showing the display area of the display device shown in FIG. 2.

FIG. 4 is a plan view showing another example of the display area of the display device shown in FIG. 2.

FIG. 5 is a cross-sectional view taken along line V-V' in FIG. 3.

FIG. 6 is a cross-sectional view taken along line VI-VI' in FIG. 3.

FIG. 8 is a cross-sectional view taken along line VIII-VIII' in FIG. 7.

FIG. 10 is a cross-sectional view taken along line X-X' in FIG. 9.

FIG. 13 is a plan view schematically showing a display area of a display device according to a fifth embodiment.

DETAILED DESCRIPTION

Figure 2:
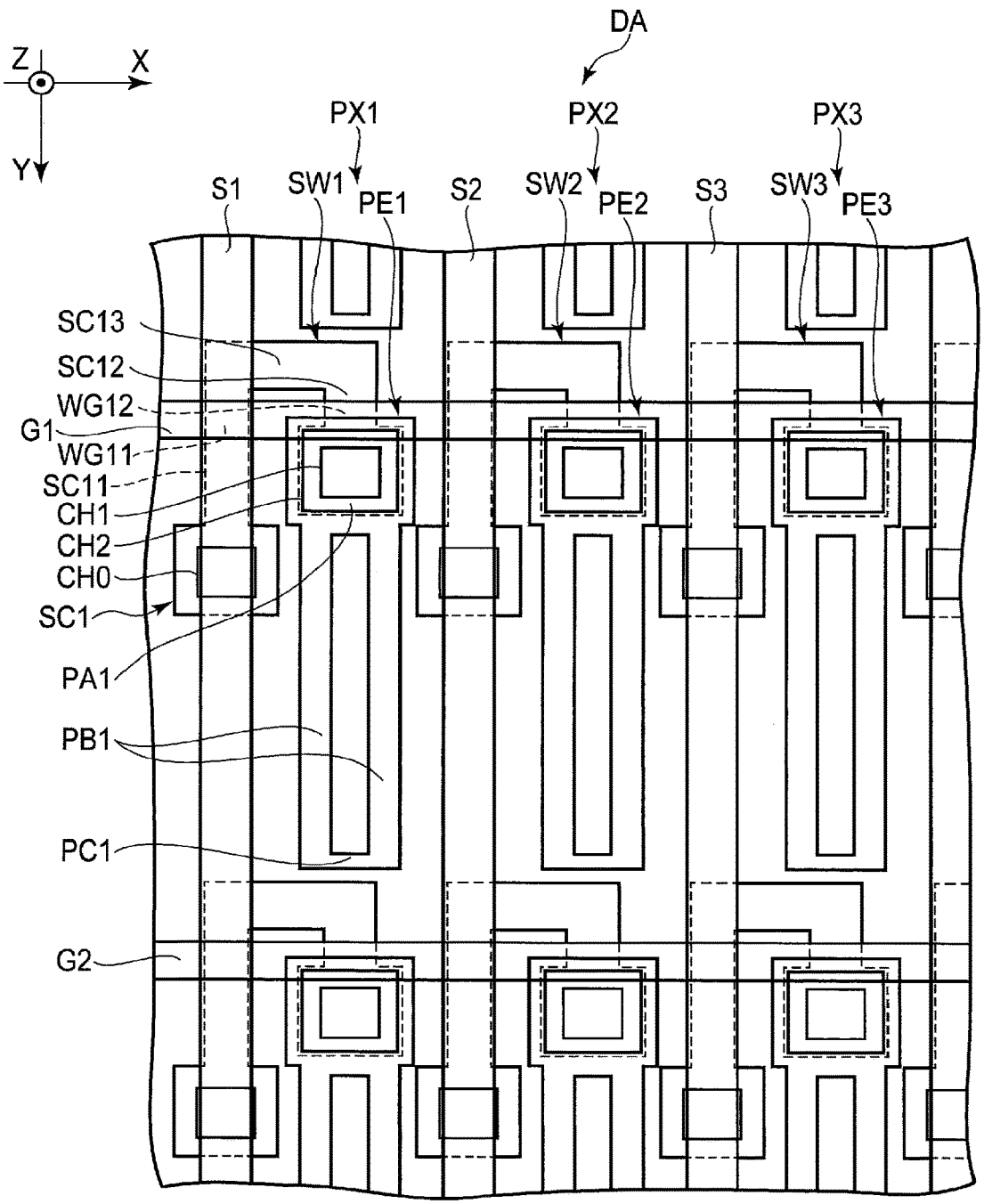
FIG. 2 is a plan view schematically showing a display area of the display device shown in FIG. 1.

In general, according to one embodiment, a display device comprises: a first substrate comprising: a semiconductor layer; a first inorganic insulating film provided above the semiconductor layer and comprising a first opening in a region which overlaps the semiconductor layer; an organic insulating film provided above the semiconductor layer and comprising a second opening in a region which overlaps the first opening; a metal film stacked on the semiconductor layer on an inner side of the region where the second opening is formed; and a pixel electrode provided in the first opening and the second opening to be in contact with the metal film and the semiconductor layer, the metal film being spaced from a first side surface of the first opening and a second side surface of the second opening.

According to another embodiment, a wiring substrate comprises: a semiconductor layer; a first inorganic insulating film provided above the semiconductor layer and comprising a first opening in a region which overlaps the semiconductor layer; an organic insulating film provided above the semiconductor layer and comprising a second opening in a region which overlaps the first opening; a first conductive layer stacked on the semiconductor layer on an inner side of the region where the second opening is formed; and a second conductive layer formed in the first opening and the second opening to be in contact with the first conductive layer and the semiconductor layer, the first conductive layer being spaced from a first side surface of the first opening and a second side surface of the second opening, and the second conductive layer being in contact with the semiconductor layer between the first side surface and the first conductive layer.

According to still another embodiment, a display device comprises: a source line, a semiconductor layer electrically connected to the source line, a relay electrode electrically connected to the semiconductor layer and a pixel electrode connected to the relay electrode, a width of the relay electrode is less than a width of the source line.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

First Embodiment

The major configuration explained in the present embodiments can also be applied to other types of display devices, for example, a liquid crystal display device comprising a liquid crystal layer, a self-light-emitting display device such as an organic electroluminescent (EL) display device, an electronic paper display device comprising an electrophoretic element and the like.

FIG. 1 is a plan view schematically showing a display device 1 according to the first embodiment.

A first direction X and a second direction Y illustrated in the figure are orthogonal to each other but may intersect at an angle other than 90 degrees. For example, the first direction X is parallel to short edges of the display device 1, and the second direction Y is parallel to long edges of the display device 1. The third direction Z is orthogonal to both the first direction X and the second direction Y and corresponds to a thickness direction of the display device 1. In the following explanation, the third direction Z is referred to as upward (or merely above), and a direction opposite to the third direction Z is referred to as downward (or merely below). Viewing from an opposite direction to the third direction Z is referred to as plan view. Further, such expressions as "the second member above the first member" and "the second member below the first member", the second member may be in contact with the first member or may be separated from the first member. In the case of the latter, the third member may be interposed between the first member and the second member. On the other hand, such expression as "the second member on the first member" and "the second member under the first component", the second member is in contact with the first member.

The display device 1 comprises a display panel 2, and a driver IC chip 3.

The display panel 2 is an active-matrix liquid crystal display panel. The display panel 2 comprises a first substrate SUB1 and a second substrate SUB2 provided above the first substrate SUB1. The first substrate SUB1 and the second substrate SUB2 attach together while opposing each other along the third direction Z while interposing a liquid crystal layer LC therebetween.

The display panel 2 may be a transmissive type comprising a transmissive display function which selectively passes light from below (an opposite side to the front surface) to display images, or a reflective type comprising a reflective display function which selectively reflects light from above (the front surface side) to display images, or a trans-reflective type comprising both the transmissive display function and the reflective display function.

The display panel 2 comprises a display area DA and a non-display area NDA. The display area DA corresponds substantially to a region where the liquid crystal layer LC is provided, and comprises a plurality of pixels PX arranged, for example, in a matrix along the first direction X and the second direction Y. The non-display area NDA surrounds the display area DA. The driver IC chip 3 for controlling the pixels PX is provided in the non-display area NDA. Although the illustration is omitted, the non-display area NDA may comprise a driver for controlling the operation of the pixels PX.

An illustration encircled by the solid line provided in the left-hand side of FIG. 1 schematically shows an example of an equivalent circuit of a pixel PX. The pixels PX are located respectively in regions each including a switching element SW located at positions where gate lines (scanning lines) G and source lines (signal lines) S cross each other. In the example illustrated, the gate lines G extend along the first direction X and the source lines S extend along the second direction Y. Each pixel PX comprises a switching element SW, a pixel electrode PE, a common electrode CE, a liquid crystal layer LC and the like. The switching element SW is formed from, for example, a thin film transistor (TFT). The gate electrode GE of the switching element SW is connected to the gate line G, the source electrode SE is connected to the source line S, and the drain electrode DE is connected to the pixel electrode PE. The pixel electrode PE opposes the common electrode CE and drives the liquid crystal layer LC with an electric field produced between the pixel electrode PE and the common electrode CE. The common electrode CE is formed over a plurality of pixels PX.

FIG. 2 is a plan view schematically showing a configuration example of the first substrate SUB1 in the display area DA shown in FIG. 1. FIG. 2 shows a plane parallel to an X-Y plane defined by the first direction X and the second direction Y. Only the main structure is shown in the drawing.

The first substrate SUB1 comprises the gate lines G (G1, G2, . . . ), the source lines S (S1, S2, S3, . . . ), switching elements SW (SW1, SW2, SW3, . . . ), pixel electrodes PE (PE1, PE2, PE3, . . . ) and the like. The gate lines G each extend along the first direction X and are arranged along the second direction Y with a gap between each adjacent pair thereof. The source lines S each extend along the second direction Y and are arranged along the first direction X with a gap between each adjacent pair thereof. In the example illustrated, the gate lines G and the source lines S extend straight but they may be bent. In the following explanation, a structure of a pixel PX1 including a switching element SW1 located near the intersection between the gate line G1 and the source line S1, and a pixel electrode PE1 connected to the switching element SW1 will be described as a typical example. Note that the structure of each of the other pixels PX2, PX3, . . . , is similar to that of the pixel PX1.

In this embodiment, the switching element SW1 is a double-gated thin film transistor including a first gate electrode WG11 and a second gate electrode WG12. A semiconductor layer SC1, which constitutes the switching element SW1, comprises two regions which cross the gate line G1. More specifically, the semiconductor layer SC1 is formed into substantially a U shape and comprises a first portion SC11 and a second portion SC12 each extending along the second direction Y to cross the gate line G1, and a third portion SC13 extending along the first direction X to connect the first portion SC11 and the second portion SC12 to each other.

The first portion SC11 extends along the second direction Y under the source line S1 and crosses the gate line G1. The first gate electrode WG11 corresponds to a region which crosses the first portion SC11 of the gate lines G1. In an end side of the first portion SC11 located between the gate line G1 and the gate line G2, a contact hole CH0 is formed. The first portion SC11 is electrically connected to the source line S1 via a conductive material provided in the contact hole CH0.

The second portion SC12 extends along the second direction Y between the source lines S1 and S2, and crosses the gate line G1. The second gate electrode WG12 corresponds to a region which crosses the second portion SC12 of the gate lines G1. Contact holes CH1 and CH2 are formed in an end side of the second portion SC12. The contact hole CH1 is located on an inner side of the region where the contact hole CH2 is formed. In the example illustrated, the contact hole CH1 is located between the two adjacent source lines S1 and S2 and between the two adjacent gate lines G1 and G2, and also closer to the gate line G1 than the contact hole CH0 formed in the first portion SC11. One end portion of the contact hole CH2 along the second direction Y overlaps the gate line G1. Note that the arrangement of the contact holes CH1 and CH2 is not limited to that of the above-described example, but may be changed as needed. The second portion SC12 is electrically connected to the pixel electrode PE1 via a conductive material provided on an inner side of the region where the contact hole CH1 is formed.

The third portion SC13 is provided along the first direction X to connect the other end side of the first portion SC11 and the other end side of the second portion SC12. That is, the third portion SC13 is located on an opposite side to the gate line G2 with respect to the gate line G1. In the example illustrated, the third portion SC13 extends straight, but may be bent.

The pixel electrode PE1 is provided between the source lines S1 and S2 and between the gate lines G1 and G2, and one end portion thereof along the second direction Y overlaps the gate line G1. The pixel electrode PE1 includes a contact portion PA1, electrode portions PB1 and a connection portion PC1. The contact portion PA1 is located near the gate line G1, and one end side thereof along the second direction Y overlaps the gate line G1. In the region of the contact portion PA1, the contact holes CH1 and CH2 are formed. The electrode portions PB1 extend toward the gate line G2 from the contact portion PA1. In the example illustrated, the pixel electrode PE1 comprises the two electrode portions PB1, but the number of the electrode portions PB1 may be one to be sufficient, or may three or more. The connection portion PC1 connects a plurality of electrode portions PB1 by their ends on a gate line G2 side. With this structure, if any of the electrode portions PB1 partially are thinned along the first direction X or broken, potential can still be supplied to the electrode portions PB1 via the connection portion PC1. Note that the connection portion PC1 may be omitted.

In the example shown in FIG. 2, the switching element SW1 is a double-gate thin film transistor, but not limited to this. For example, a single-gate thin film transistor may be employed as well.

FIG. 3 shows an expanded view of the vicinity of the contact holes CH1 and CH2 shown in FIG. 2. Here, the illustration of the pixel electrodes PE is omitted. The contact hole CH3 is formed on an inner side of the region where the contact hole CH1 is formed. Within the region where the contact hole CH2 is formed, the relay electrode RE which overlaps at least the contact hole CH3 is formed. The semiconductor layer SC1 is electrically connected to the pixel electrode PE (not shown) provided in the contact holes CH2, CH1 and CH3 via the relay electrode RE.

The contact hole CH2 substantially overlaps the second portion SC12 of the semiconductor layer SC1. The contact hole CH2 is illustrated to have, for example, a rectangular shape comprising edges CH2a and CH2b opposing the first direction X and edges CH2c and CH2d opposing the second direction Y.

A distance between the edges CH2a and CH2b of the contact hole CH2 along the first direction X, i.e., a width H2 of the contact hole CH2 along the first direction X is less an interval H0 between the source lines S1 and S2 along the first direction X. In the example illustrated, the contact hole CH2 is located in substantially a central portion between the source lines S1 and S2. In other words, a distance between the edge CH2a and the source line S1 along the first direction X and a distance between the edge CH2b and the source line S2 along the first direction X are substantially the same, which is E1. Note that the contact hole CH2 may be formed to be close to one of the source lines S1 and S2. The contact hole CH2 as such is formed in a fourth insulating film (organic insulating film), which will be described later.

The contact hole CH1 is formed in a region on an inner side of the contact hole CH2. Therefore, the contact hole CH1 overlaps the second portion SC12 of the semiconductor layer SC1 and the contact hole CH2. The contact hole CH1 has, for example, a rectangular shape comprising edges CH1a and CH1b opposing the first direction X and edges CH1c and CH1d opposing the second direction Y.

A distance between the edges CH1a and CH1b of the contact hole CH1 along the first direction X, i.e., a width H1 of the contact hole CH1 along the first direction X is less than the width H2 of the contact hole CH2 along the first direction X. In the example illustrated, the contact hole CH1 is located in substantially a central portion of the contact hole CH2. In other words, the edges CH1a, CH1b, CH1c and CH1d of the contact hole CH1 are located on an inner side as compared to the edges CH2a, CH2b, CH2c and CH2d of the contact hole CH2, respectively, substantially equally by only a distance E2. Note that the contact hole CH1 should just be located on an inner side of the contact hole CH2 in plan view and may be formed to be close to any one of the edges CH2a, CH2b, CH2c and CH2d of the contact hole CH2. The contact hole CH1 as such is formed in a fifth insulating film (capacitive nitride film), which will be discussed later.

The contact hole CH3 is formed in the region on an inner side of the contact hole CH1. Thus, the contact hole CH3 overlaps the second portion of the semiconductor layer SC1, the contact hole CH2 and the contact hole CH1. The contact hole CH3 is illustrated to have, for example, a rectangular shape and is located in substantially a central portion of the contact hole CH1. A width H3 of the contact hole CH3 along the first direction X of is less than the width H1 of the contact hole CH1 along the first direction X. Note that the contact hole CH3 should just be located inside the contact hole CH1 in plan view and may be formed close to any one of the edges CH1a, CH1b, CH1c and CH1d of the contact hole CH1. The contact hole CH3 as such is formed in a second insulating film and a third insulating film (a gate insulating film and an interlayer insulating film), which will be discussed later, to expose the second portion SC12 of the semiconductor layer SC1.

The relay electrode RE is located on an inner side of the region where the contact hole CH2 is formed. In the example illustrated, the relay electrode RE comprises regions which overlap the contact hole CH1, CH2 and CH3, respectively. The relay electrode RE is illustrated to have, for example, a rectangular shape comprising edges REa and REb opposing the first direction X and edges REc and REd opposing the second direction Y.

A distance between the edges REa and REb of the relay electrode RE along the first direction X, i.e., a width HR of the relay electrode RE along the first direction X is less than the width H3 of the contact hole CH3 along the first direction X. Note that the width HR should just be equal to or less than the width H3. The width HR may be equal to or less than, for example, a width A1 of the source line S along the first direction X. In order to meet the demand for a higher definition, in which the width (or interval H0) of the pixels PX need to be reduced, the width HR should desirably be reduced to less than the width A1. The source lines S need to have a certain dimension in width A1 in consideration of the yield in manufacture to avoid disconnection of wiring, etc., but the relay electrode RE can be formed to be more slender than the source lines S since such a disconnection problem need not be taken into consideration.

In the example illustrated, the relay electrode RE is located in substantially a central portion of the contact hole CH2 along the first direction X and close to the edge CH2c of the contact hole CH2 along the second direction Y. That is, the edges REa and REb of the relay electrode RE are located on an inner side along the first direction X as compared respectively to the edges CH2a and CH2b of the contact hole CH2 substantially equally by only the distance E3 and also on an inner side of the contact hole CH3. On the other hand, the edge REc of the relay electrode RE is located between the edge CH2c of the contact hole CH2 and the edge CH1c of the contact hole CH1 along the second direction Y, and the edge REd is located on an inner side of the contact hole CH3. Note that the relay electrode RE should just be located on the inner side of the contact hole CH2 and comprise a region which overlaps the contact hole CH3 in plan view, and may be formed close to any one of the edge CH2a, CH2b and CH2d of the contact hole CH2.

The distance E3 is set to be greater than the distance E1. Thus, even if, for example, the position of the contact hole CH2 is displaced along the first direction X during the manufacture of the display device 1, the relay electrode RE is formed on the inner side of the region where the contact hole CH2 is formed.

In this embodiment, a minimum dimension W of the pixel PX along the first direction X is defined as a distance (or a pitch of the source lines) along the first direction X between an end portion of the source line S1 in the first direction X and an end portion of the source line S2 in the first direction X. When a width of the source line S1 and the source line S2 along the first direction X is represented by A1, the minimum dimension W of the pixel PX in the above-described configuration is expressed by:

$$W=(E1\times 2)+(E2\times 2)+H1+A1.$$

Note that in the above-provided explanation, the contact holes CH1, CH2 and CH3 are illustrated to have a rectangular shape in the X-Y plane, but may be formed into some other shape. For example, as shown in FIG. 4, when the contact holes CH0, CH1, CH2 and CH3 are circular, the widths H1, H2 and H3 of the contact holes CH1, CH2, and CH3 along the first direction X are equivalent to diameters of the contact holes CH1, CH2 and CH3. Further, the edges CH1a and CH1b and the edges CH2a and CH2b are equivalent to two points on each of respective circumferences opposing the first direction X, whereas the edges CH1c and CH1d and the edges CH3c and CH3d are equivalent to two points on each of respective circumferences opposing the second direction Y. Note that if the contact hole CH1, CH2, and CH3 are not rectangular or circular, but of an elliptical shape or that of a combination of, for example, straight lines and curves, the widths H1, H2 and H3 of the contact hole CH1, CH2 and CH3 along the first direction X are considered to be the greatest intervals along the first direction X.

FIG. 5 is a cross section taken along line V-V' shown in FIG. 3. FIG. 5 shows a plane parallel to the X-Z plane defined by the first direction X and the third direction Z.

The display device 1 comprises a first substrate SUB1, a second substrate SUB2 and a liquid crystal layer LC held between the first substrate SUB1 and the second substrate SUB2.

The first substrate SUB1 is formed from a transparent first insulating substrate 10 of a glass or resin substrate, or the like. The first substrate SUB1 comprises, on a side of the first insulating substrate 10, which opposes the second substrate SUB2, semiconductor layers SC1 and SC2, source lines S1 and S2, a relay electrode RE, a pixel electrode PE1, a common electrode CE, a first alignment film AL1, a first insulating film 11, a second insulating film 12, a third insulating film 13, a fourth insulating film 14, a fifth insulating film 15, etc.

The first insulating film 11 is formed on the first insulating substrate 10 and functions as an undercoat layer of the semiconductor layer SC1. The semiconductor layers SC1 and SC2 are formed on the first insulating film 11. A first portion SC11 and a second portion SC12 of the semiconductor layer SC1 and a first portion SC21 of the semiconductor layer SC2 are spaced apart from each other along the first direction X. The second insulating film 12 is a gate insulating film, which covers the semiconductor layers SC1 and SC2, and is formed also on the first insulating film 11. Although not shown in FIG. 5, the gate lines G are formed on the second insulating film 12. The third insulating film 13 is an interlayer insulating film provided on the second insulating film 12 and the gate lines G (not shown). The first insulating film 11, the second insulating film 12, and the third insulating film 13 are each formed from, for example, an inorganic insulating material such as silicon oxide, silicon nitride or silicon oxynitride.

In this embodiment, the second insulating film 12 and the third insulating film 13 each may be called "a second inorganic insulating film". In the second inorganic insulating film (namely, the third insulating film 13 and the second insulating film 12) of the region where the second portion SC12 of the semiconductor layer SC1 is provided, a contact hole CH3 (third opening) penetrating to the second portion SC12 of the semiconductor layer SC1 is formed. In other words, the contact hole CH3 overlaps partially the second portion SC12 of the semiconductor layer SC1.

In the following explanation, side surfaces of the third insulating film 13 and the second insulating film 12 which constitute the contact hole CH3 may be called "a side surface of the contact hole CH3". Further, the boundary between the side surface of the contact hole CH3 and the second portion SC12 of the semiconductor layer SC1 may be called an "edge" of the contact hole CH3. FIG. 5 shows an edge CH3a as a typical example. That is, the edge CH3a is equivalent to the boundary between one side surface CH3A of the contact hole CH3 along the first direction X and the second portion SC12 of the semiconductor layer SC1.

The relay electrode RE (metallic film) is stacked on the second portion SC12 of the semiconductor layer SC1 in the contact hole CH3. In the example illustrated, the relay electrode RE is spaced from one side surface CH3A of the contact hole CH3 along the first direction X and another side surface CH3B thereof. That is, as shown in FIG. 5, the relay electrode RE is configured not to cover the entire opening region of the contact hole CH3 but to expose a portion of the second portion SC12 of the semiconductor layer SC1 in the region where the relay electrode RE is not formed. The relay electrode RE is formed from, for example, a metal material such as aluminum or titanium. Note that the edge REa of the relay electrode RE shown in FIG. 3 is equivalent to the one end of the relay electrode RE along the first direction X. FIG. 5 shows only the edge REa as a typical example, but the other edges REb, REc and Red have a configuration similar to the above.

The source lines S1 and S2 are formed on the third insulating film 13. The source line S2 is located on an opposite side to the source line S1 with respect to the contact hole CH1. The source lines S1 and S2 are formed in the same manufacturing process and from the same material as those of the relay electrode RE.

The fourth insulating film 14 (organic insulating film) covers the source lines S1 and S2 and is formed also on the third insulating film 13. The fourth insulating film 14 is a planarizing film formed from, for example, an organic insulating material such as polyimide.

The fourth insulating film 14 comprises the contact hole CH2 (second opening) formed therein to penetrate to the third insulating film 13, in a region which further includes the region where the contact hole CH3 is provided. In other words, the contact hole CH2 includes a region overlapping the second portion SC12 of the semiconductor layer SC1, the contact hole CH3 and the relay electrode RE.

In the following explanation, a side surface of the fourth insulating film 14 which constitutes the contact hole CH2 may be called "a side surface of the contact hole CH2". The edge CH2a of the contact hole CH2 shown in FIG. 3 is equivalent to a boundary between one side surface CH2A of the contact hole CH2 along the first direction X and the third insulating film 13. FIG. 5 shows the edge CH2a as a typical example, and the other edges have a configuration similar to that of the above.

The common electrode CE is formed on the fourth insulating film 14 except the region where the contact hole CH2 is formed. The fifth insulating film 15 covers the common electrode CE and is formed also on the fourth insulating film 14. The fifth insulating film 15 covers the side surfaces CH2A and CH2B of the contact hole CH2 and also is in contact with the third insulating film 13 in the contact hole CH2. The fifth insulating film 15 is a capacitive nitride film formed from, for example, an inorganic insulating material such as silicon nitride or silicon oxynitride, and forms a capacitance between the common electrode CE and the pixel electrode PE, which will be described later. In this embodiment, the fifth insulating film 15 may be called "a first inorganic insulating film".

The fifth insulating film 15 comprises a contact hole CH1 (first opening) formed therein to penetrate to the third insulating film 13 in a region on an inner side of the region where the contact hole CH2 is formed, and also including the region where the contact hole CH3 is formed. In other words, the contact hole CH1 includes a region overlapping the second portion SC12 of the semiconductor layer SC1, the contact hole CH3, the relay electrode RE and the contact hole CH2.

In the following explanation, a side surface of the fifth insulating film 15 which constitutes the contact hole CH1 may be called "a side surface of the contact hole CH1". The edge CH1a of the contact hole CH1 shown in FIG. 3 is equivalent to a boundary between the one side surface CH1A of the contact hole CH1 along the first direction X and the third insulating film 13. FIG. 5 shows the edge CH1a as a typical example, and the other edges have a configuration similar to that of the above.

Note that the relay electrode RE is spaced apart also from the side surfaces CH2A and CH2B of the contact hole CH2 and the side surfaces CH1A and CH1B of the contact hole CH1.

The pixel electrode PE is provided in the contact holes CH1, CH2 and CH3 and to be in contact with at least the relay electrode RE. Thus, the pixel electrode PE and the semiconductor layer SC1 are electrically connected to each other via the relay electrode RE.

Specifically, in the contact hole CH2, the pixel electrode PE covers the fifth insulating film 15. In the contact hole CH1, the pixel electrode PE covers the side surfaces CH1A and CH1B of the contact hole CH1 along the first direction X and also is in contact with the third insulating film 13 exposed by the contact hole CH1. In the contact hole CH3, the pixel electrode PE covers the side surfaces CH3A and CH3B of the contact hole CH3 along the first direction X and also is in contact with the relay electrode RE. In the example illustrated, the pixel electrode PE is in contact also with the second portion SC12 of the semiconductor layer SC1 between the side surface CH3A and the relay electrode RE and between the side surface CH3B and the relay electrode RE. In other words, in the contact hole CH3, the relay electrode RE and the pixel electrode PE are in contact with the second portion SC12 of the semiconductor layer SC1.

The common electrode CE and the pixel electrode PE are each formed from, for example, a transparent conductive material such as indium tin oxide (ITO) or indium zinc oxide (IZO).

The pixel electrode PE and the fifth insulating film 15 are covered by the first alignment film AL1.

On the other hand, the second substrate SUB2 is formed from a transparent second insulating substrate 20 of a glass or resin substrate or the like. The second substrate SUB2 comprises, on a side of the second insulating substrate 20, which opposes the first substrate SUB1, a light-shielding film BM, a color filter layer 21, an overcoat layer OC, a second alignment film AL2, etc. The light-shielding film BM is formed on a side of the second insulating substrate 20, which opposes the first substrate SUB1, so as to partition the pixels PX from each other. The color filter layer 21 is formed on a side of the second insulating substrate 20, which opposes in first substrate SUB1. The color filter layer 21 includes a plurality of color filters, which are not illustrated. The color filter is formed from, for example, a resin material colored in red, green, blue or the like. The overcoat layer OC is formed from a transparent resin material, so as to cover the color filter layer 21. The overcoat layer OC is covered by the second alignment film AL2. Note that the color filter layer 21 may be provided in the first substrate SUB1.

The first substrate SUB1 and the second substrate SUB2 configured as above are disposed to oppose each other so that the first alignment film AL1 and the second alignment film AL2 are arranged to oppose each other, and then they are attached together with a sealing material, which is not illustrated. Between the first alignment film AL1 and the second alignment film AL2, a liquid crystal composition containing liquid crystal molecules is sealed and thus the liquid crystal layer LC is formed.

FIG. 6 is a cross section taken along line VI-VI' shown in FIG. 3. FIG. 6 shows a plane parallel to the Y-Z plane defined by the second direction Y and the third direction Z. Here, only the first substrate SUB1 is shown and the illustration of the liquid crystal layer LC and the second substrate SUB2 is omitted.

The structure from the first insulating substrate 10 to the second insulating film 12 is the same as that shown in FIG. 5, and therefore the explanation thereof is omitted.

The gate line G1 is formed on the second insulating film 12. The gate line G1 overlaps the second portion SC12 of the semiconductor layer SC1. The third insulating film 13 covers the gate line G1 and also is formed on the second insulating film 12.

The contact hole CH3 and the contact hole CH1 are spaced apart from the gate line G1 along the second direction Y. On the other hand, the contact hole CH2 partially overlaps the gate line G1.

The relay electrode RE is formed on the second portion SC12 of the semiconductor layer SC1 in the contact hole CH3 and also one end portion thereof along the second direction Y is in contact with one side surface CH3C of the contact hole CH3 along the second direction Y. On the other hand, the other end portion of the relay electrode RE along the second direction Y is spaced apart from another side surface CH3D of the contact hole CH3 along the second direction Y. In the example illustrated, the relay electrode RE covers the side surface CH3C of the contact hole CH3 and also formed on the third insulating film 13 in the contact holes CH1 and CH2. In other words, the relay electrode RE is in contact with the third insulating film 13 in the contact holes CH1 and CH2. The relay electrode RE formed on the third insulating film 13 is spaced from the side surface CH2C of the contact hole CH2 along the second direction Y and is partially covered by the fifth insulating film 15.

The fifth insulating film 15 covers the side surfaces CH2C and CH2D of the contact hole CH2 and also is in contact with the third insulating film 13 in the contact hole CH2. Further, the fifth insulating film 15 covers one end portion of the relay electrode RE formed on the third insulating film 13 in the contact hole CH2. In other words, the fifth insulating film 15 is in contact with the relay electrode RE in the contact hole CH2 and also with the third insulating film 13 between the one end portion of the relay electrode RE along the second direction Y and the side surface CH2C of the contact hole CH2.

The pixel electrode PE is in contact with the relay electrode RE in the contact hole CH3 and also with the second portion SC12 of the semiconductor layer SC1 between the side surface CH3D of the second direction Y and the relay electrode RE. The pixel electrode PE covers one side surface CH1C along the second direction Y and also is in contact with the relay electrode RE in the contact hole CH1. Further, the pixel electrode PE covers another side surface CH1D along the second direction Y and also is in contact with the third insulating film 13 in the contact hole CH1. The pixel electrode PE covers the fifth insulating film 15 in the contact hole CH2.

Note that the arrangement of the relay electrode RE in the X-Y plane is not limited to that described above. The arrangement of the relay electrode RE may be rotated by 90 degrees in the X-Y plane. Further, the shape of the relay electrode RE is not limited to rectangular, but may be, for example, circular, or elliptical or a shape consisting of a straight line and a curve. The width HR of the relay electrode can be defined as the width in its bottom portion along the first direction X.

According to this embodiment, the width HR of the relay electrode RE is set equal to or less than the width H3 of the contact hole CH3 along the first direction X, and thus the minimum dimension W of the pixel PX can be reduced. For example, if the width HR of the relay electrode RE is greater than the width H3 of the contact hole CH3, the both end portions of the relay electrode RE along first direction X are formed on the third insulating film 13. In this case, it is required to provide a margin so as to avoid the source lines S and the relay electrode RE formed in the same layer from being contact with each other. For this reason, the minimum dimension W of the pixels PX along the first direction X must increase by this margin. By contrast, according to this embodiment, while the source line S is formed on the third insulating film 13 in the first direction X, the relay electrode RE is formed on the semiconductor layer SC1 and thus not arranged to be adjacent to the source lines S on the third insulating film 13. Therefore, it is not necessary to provide a margin between the source lines S and the relay electrode RE. Thus, a higher definition of the display device 1 is achieved.

Moreover, according to this embodiment, the fourth insulating film 14 comprising the contact hole CH2 formed therein is formed on the third insulating film 13. The side surfaces CH2A, CH2B, CH2C and CH2D of the contact hole CH2 are covered by the fifth insulating film 15, and the fifth insulating film 15 is in contact with the third insulating film 13 in the contact hole CH2. That is, the fourth insulating film 14 formed from an organic insulating material is covered with the inorganic insulating material. Therefore, discharge of gas from the fourth insulating film 14 of the organic insulating materials to the liquid crystal layer LC can be suppressed. Further, the fourth insulating film 14 and the conductive layers, for example, the pixel electrode PE, in the contact hole CH1, CH2 and CH3 are shut off from each other by the fifth insulating film 15. Therefore, the entering of moisture from the fourth insulating film 14 to the region where the contact hole CH1, CH2 and CH3 are formed can be suppressed, thereby suppressing the corrosion of the conductive layers in the contact hole CH1, CH2 and CH3. Thus, the reliability of the contact portion can be improved.

Second Embodiment

Figure 7:
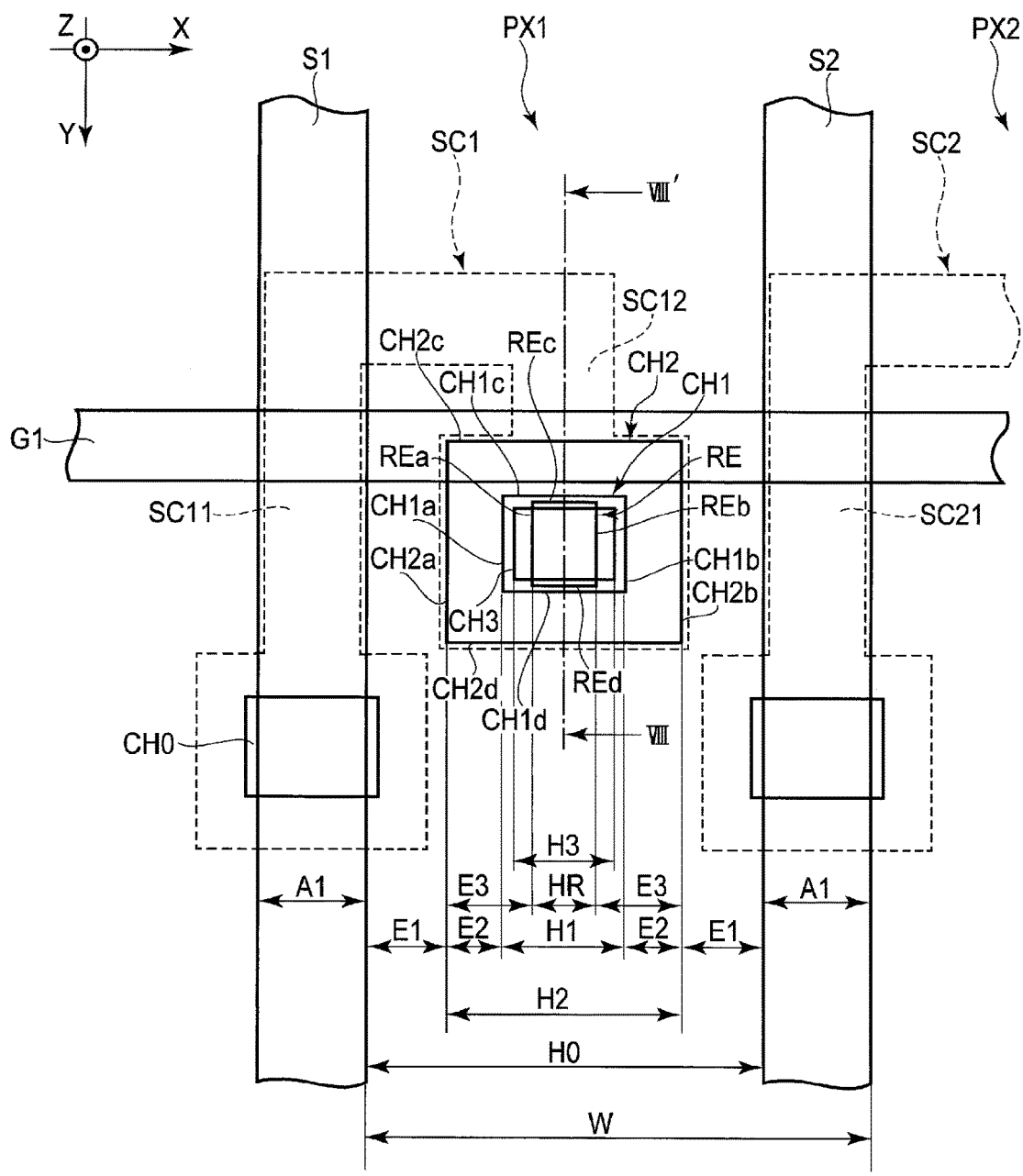
FIG. 7 is a plan view schematically showing a display area of a display device according to a second embodiment.

FIG. 7 is a plan view schematically showing a display device 1 according to the second embodiment. The second embodiment is different from the first embodiment in that both end portions of the relay electrode RE along the second direction Y are located on an inner side of the contact hole CH1. More specifically, an edge REc of the relay electrode RE is located between an edge CH3c of the contact hole CH3 and an edge CH1c of the contact hole CH1, and the edge REd is located between an edge CH3d of the contact hole H3 and the edge CH1d of the contact hole CH1.

FIG. 8 shows a cross section taken along line VIII-VIII' shown in FIG. 7. FIG. 8 shows a plane parallel to the Y-Z plane defined by the second direction Y and the third direction Z. Here, only the first substrate SUB1 is shown.

The relay electrode RE is formed on the second portion SC12 of the semiconductor layer SC1 in the contact hole CH3 and also in contact with side surfaces CH3C and CH3D of the contact hole CH3 along the second direction Y. In the example illustrated, the relay electrode RE covers the side surfaces CH3C and CH3D of the contact hole CH3 and is formed also on the third insulating film 13 in the contact hole CH1. The relay electrode RE formed on the third insulating film 13 in the contact hole CH1 is spaced from the side surfaces CH1C and CH1D of the contact hole CH1 and the side surfaces CH2C and CH2D of the contact hole CH2.

The pixel electrode PE is in contact with the relay electrode RE in the contact hole CH3. The pixel electrode PE covers the relay electrode RE and the fifth insulating film 15 in the contact hole CH1 and also is in contact with the third insulating film 13. In other words, the pixel electrode PE is in contact with the third insulating film 13 between the side surface CH1C and the relay electrode RE and between the side surface CH1D and the relay electrode RE in the contact hole CH1.

In this embodiment as well, an advantageous effect similar to that of the first embodiment can be obtained. Further, since a contact area can be assured between the relay electrode RE and the second portion SC12 of the semiconductor layer SC1, the conductivity between the semiconductor layer SC1 and the relay electrode RE can be improved.

Third Embodiment

Figure 9:
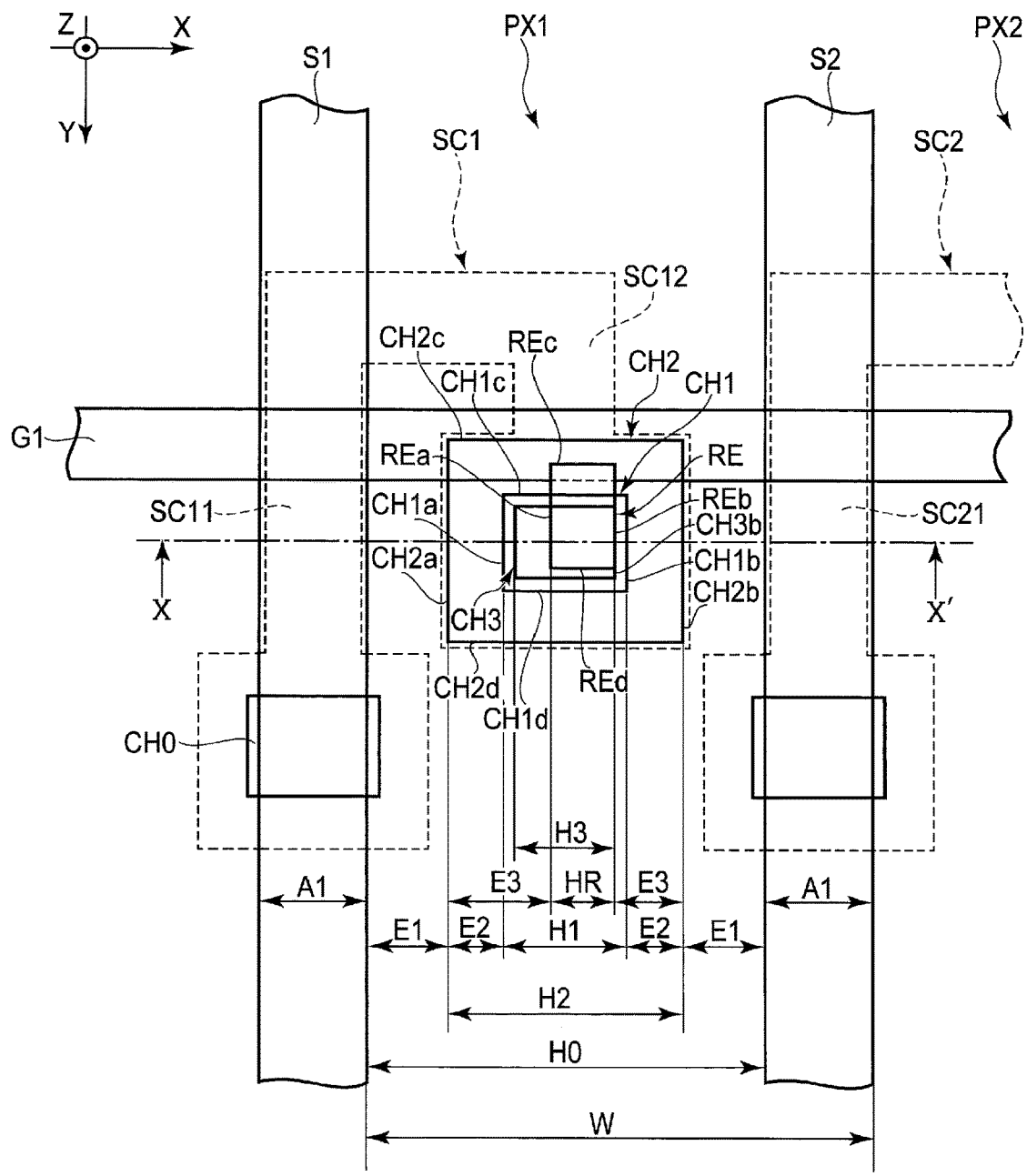
FIG. 9 is a plan view schematically showing a display area of a display device according to a third embodiment.

FIG. 9 is a plan view schematically showing a display device 1 according to the third embodiment. Third embodiment is different from the first embodiment in that the relay electrode RE is close to an edge CH3b of the contact hole CH3 along the first direction X. In the example illustrated, the edge REb of the relay electrode RE overlaps the edge CH3b of the contact hole CH3.

FIG. 10 shows a cross section taken along line X-X' shown in FIG. 9. FIG. 10 shows a plane parallel to the X-Z plane defined by the first direction X and the third direction Z. Here, only the first substrate SUB1 is shown.

One end portion of the relay electrode RE along the first direction X is in contact with the side surface CH3B of the contact hole CH3 in the contact hole CH3. On the other hand, the other end portion of the relay electrode RE along the first direction X is spaced from the side surface CH3A of the contact hole CH3. The pixel electrode PE is in contact with the relay electrode RE in the contact hole CH3 and also with the second portion SC12 of the semiconductor layer SC1 between the relay electrode RE and the side surface CH1A of the contact hole CH1. In this embodiment as well, an advantageous effect similar to that of the first embodiment can be obtained.

Fourth Embodiment

Figure 11:
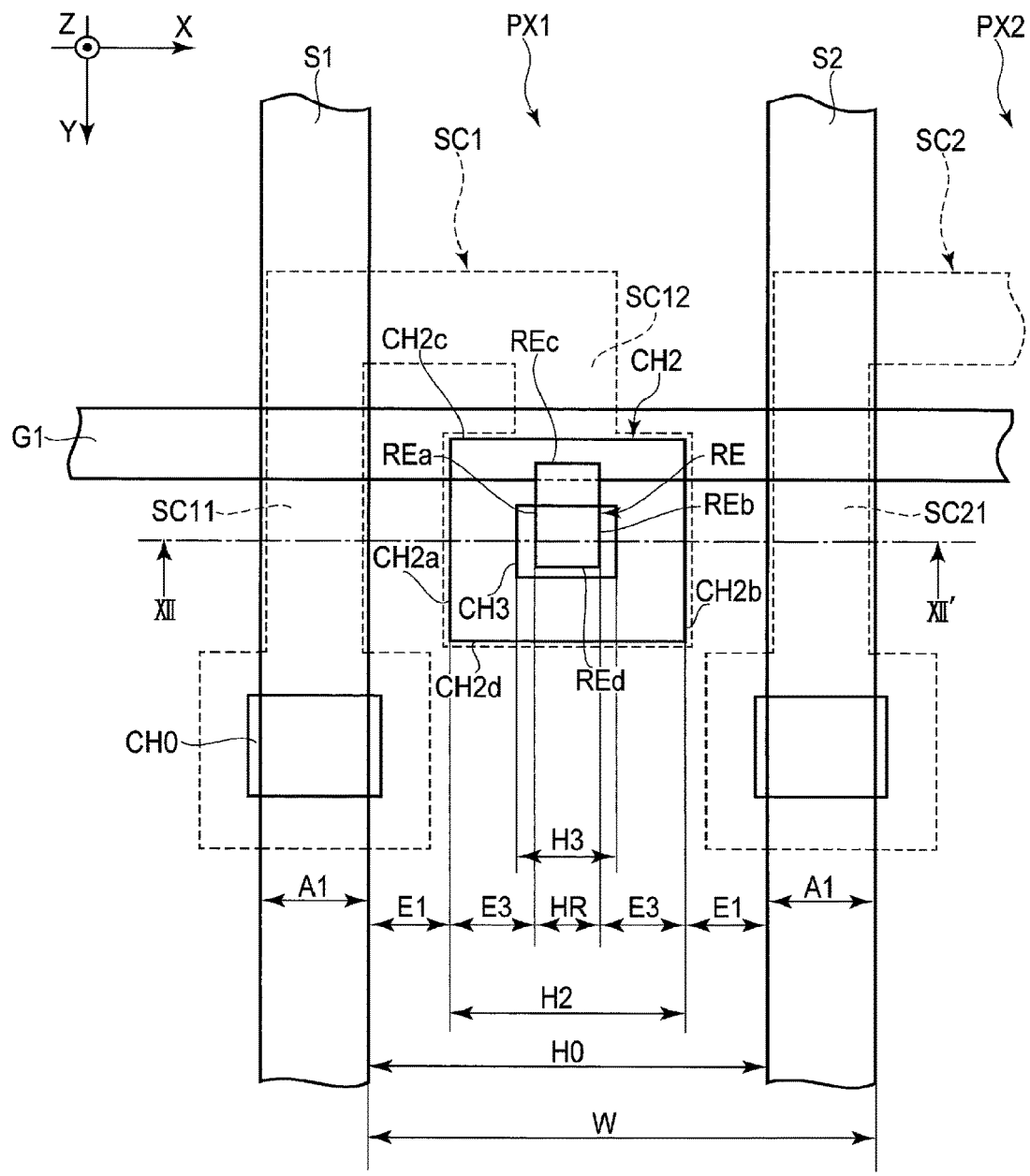
FIG. 11 is a plan view schematically showing a display area of a display device according to a fourth embodiment.

FIG. 11 is a plan view schematically showing a display device 1 according to the fourth embodiment. The fourth embodiment is different from the first to third embodiments in that the first substrate SUB1 does not comprise the contact hole CH1.

Figure 12:
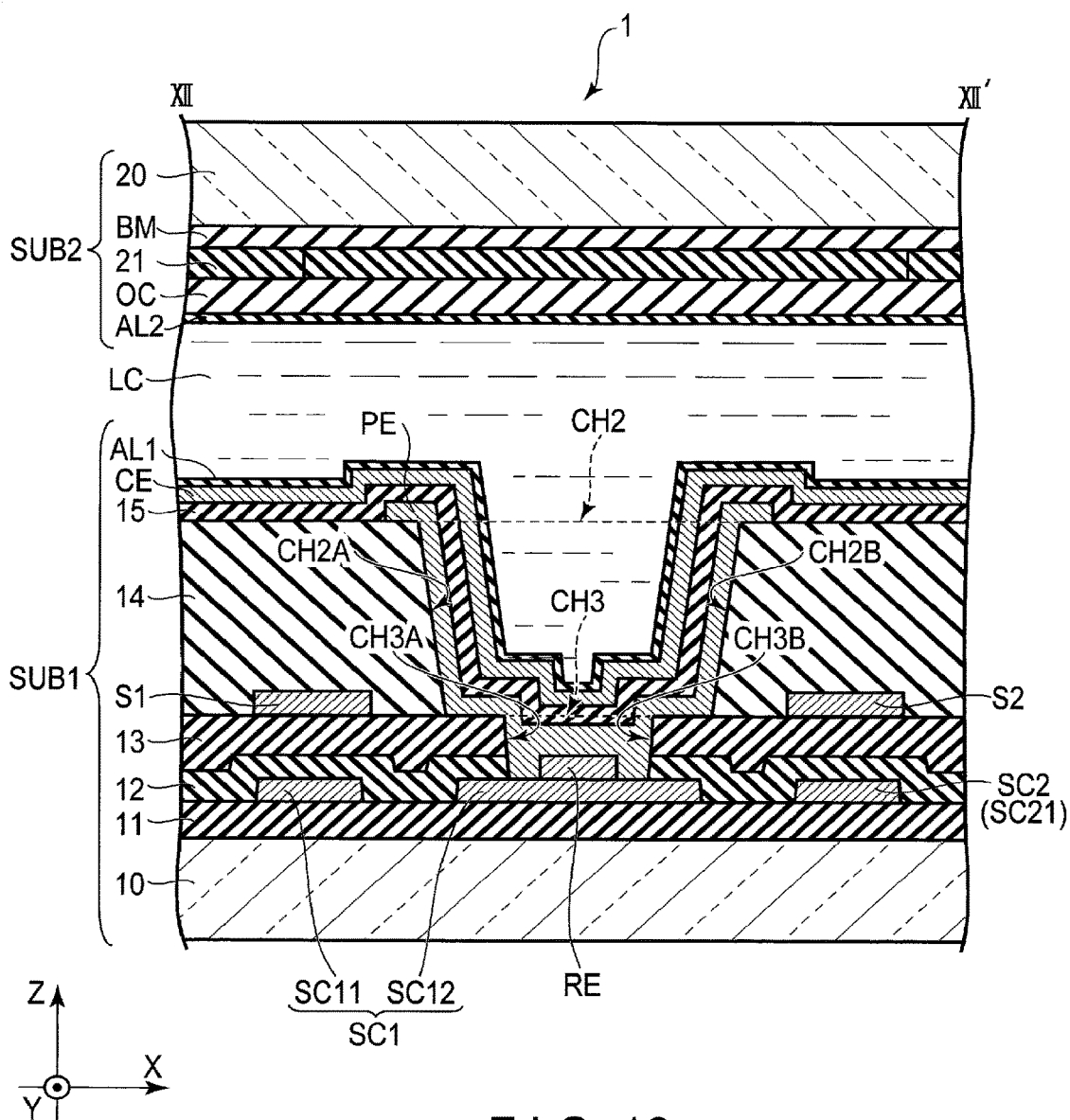
FIG. 12 is a cross-sectional view taken along line XII-XII' in FIG. 11.

FIG. 12 shows a cross section taken along line XII-XII' shown in FIG. 11.

As shown in FIG. 12, in the fourth embodiment, the common electrode CE is provided above the pixel electrode PE. In this embodiment, the second insulating film 12 and the third insulating film 13 may be called a "first inorganic insulating film", and the fifth insulating film 15 may be called "a second inorganic insulating film". Further, in this embodiment, the contact hole CH3 formed in the second insulating film 12 and the third insulating film 13 corresponds to the first opening. That is, in this embodiment, the first inorganic insulating film (the second insulating film 12 and the third insulating film 13) comprises the first opening (the contact hole CH3) which exposes the semiconductor layer SC1 and the relay electrode RE.

The pixel electrode PE is provided between the source line S1 and the source line S2 on the fourth insulating film 14 (the organic insulating film) and in the contact hole CH2 (the second opening) and the contact hole CH3 (the first opening). The pixel electrode PE covers the side surfaces CH2A and CH2B along the first direction X in the contact hole CH2 and also is in contact with the third insulating film 13 exposed by the contact hole CH2. The pixel electrode PE covers the side surfaces CH3A and CH3B along the first direction X and the relay electrode RE in the contact hole CH3 and also is formed on the second portion SC12 of the semiconductor layer SC1 exposed by the contact hole CH3. In other words, the pixel electrode PE is in contact with the second portion SC12 of the semiconductor layer SC1 between the side surface CH3A of the contact hole CH3 and the relay electrode RE and between the side surface CH3B of the contact hole CH3 and the relay electrode RE.

The fifth insulating film 15 (the second inorganic insulating film) covers the pixel electrode PE and also is formed on the fourth insulating film 14. In this embodiment, the fifth insulating film 15 does not comprise an opening. The common electrode CE is provided on the fifth insulating film 15. The common electrode CE is covered by the first alignment film AL1.

In this embodiment as well, an advantageous effect similar to that of the first embodiment can be obtained. Further, in this embodiment, the pixel electrode PE covers the side surfaces CH2A, CH2B, CH2C and CH2D of the contact hole CH2, the third insulating film 13 exposed by the contact hole CH2 and the side surfaces CH3A, CH3B, CH3C and CH3D of the contact hole CH3, collectively. The fifth insulating film 15 and the common electrode CE are provided also in the contact holes CH2 and CH3 so as to cover the pixel electrode PE. Thus, the sealing property of the fourth insulating film 14 in the contact portion can be improved, thus enhancing the reliability of the contact portion.

Fifth Embodiment

FIG. 13 is a cross section schematically showing a display device 1 according to the fifth embodiment. The fifth embodiment is different from the fourth embodiment in that the display device is an organic EL display device.

The display device 1 comprises a first substrate SUB1 and a second substrate SUB2.

The first substrate SUB1 is formed from a first insulating substrate 30 of, for example, an organic insulating material such as polyimide. The first insulating substrate 30 may have flexibility. The first substrate SUB1 comprises, above the first insulating substrate 30, i.e., on a side which opposes the first substrate SUB2, a switching element SW, an organic EL device OD as a light-emitting device, a first insulating film 11, a second insulating film 12, a third insulating film 13, a fourth insulating film 14, a sixth insulating film 16, a protective film 50, etc. Further, under the first insulating substrate 30, a protection member PP is provided via an adhesive layer (not shown). The protection member PP is a protection film which protects the first insulating substrate 30 and is formed of, for example, polyethylene terephthalate (PET).

The first insulating film 11 is formed on the first insulating substrate 30. The switching element SW is formed on the first insulating film 11. The switching element SW is formed from, for example, a thin film transistor (TFT). The switching element SW comprises a semiconductor layer SC, a gate electrode GE, a source electrode SE and a drain electrode DE. The semiconductor layer SC is formed on the first insulating film 11, and is covered by the second insulating film 12. The gate electrode GE is formed on the second insulating film 12, and is covered by the third insulating film 13. The source electrode SE is formed on the third insulating film 13, and is connected to the semiconductor layer SC via a contact hole formed in the third insulating film 13 and the second insulating film 12.

In this embodiment, the second insulating film 12 and the third insulating film 13 may be called a "first inorganic insulating film". Further, in this embodiment, the contact hole CH3 formed in the second insulating film 12 and the third insulating film 13 corresponds to the first opening. That is, in this embodiment, the first inorganic insulating film (the second insulating film 12 and the third insulating film 13) comprises the first opening (the contact hole CH3) in a region which overlaps with the semiconductor layer SC1.

The contact hole CH3 (the first opening) is provided in the third insulating film 13 and the second insulating film 12 and on opposite side to the source electrode SE with respect to the gate electrode GE. The drain electrode DE is formed on the semiconductor layer SC exposed by the contact hole CH3. The drain electrode DE corresponds to the relay electrode RE in the first embodiment. The drain electrode DE is spaced apart from the side surfaces CH3A and CH3B of the contact hole CH3.

The fourth insulating film 14 (the organic insulating film) covers the switching element SW and also is formed on the third insulating film 13. The fourth insulating film 14 is formed from, for example, an organic insulating material such as polyimide. The contact hole CH2 (the second opening) is formed in a region within the fourth insulating film 14, which overlaps the contact hole CH3. The contact hole CH2 is wider than the contact hole CH3.

The organic EL device OD is formed on the fourth insulating film 14. The organic EL device OD comprises a pixel electrode PE, an organic light-emitting layer ORG and a common electrode CE. In the example illustrated, the organic EL device OD is a top emission types, which emit light to an opposite side to the first insulating substrate 30, but not limited to this example. For example, it may be a bottom emission type, which emits light to a first insulating substrate 30 side. Although not shown, in the case where the display device 1 is of a top emission type, the organic EL device OD should desirably comprise a reflective layer between the fourth insulating film 14 and the pixel electrode PE. The reflective layer is formed from, for example, a highly reflective metal material such as aluminum.

The pixel electrode PE is provided on the fourth insulating film 14 and also in the contact holes CH2 and CH3, and is in contact with, i.e., electrically connected to the drain electrode DE. The pixel electrode PE covers the side surfaces CH2A and CH2B in the contact hole CH2 and also is formed on the third insulating film 13 exposed by the contact hole CH2. The pixel electrode PE covers the side surface CH3A and CH3B and the drain electrode DE in the contact hole CH3, and also is formed on the semiconductor layer SC. In other words, the pixel electrode PE is in contact with the semiconductor layer SC between the side surface CH3A of the contact hole CH3 and the drain electrode DE, and between the side surface CH3B of the contact hole CH3 and the drain electrode DE.

The organic light-emitting layer ORG emits light at the brightness according to voltage (or current) applied between the pixel electrode PE and the common electrode. The organic light-emitting layer ORG may comprises additional layers other than a light-emitting layer, such as an electron injection layer, a hole injection layer, an electron transport layer, a hole transport layer and the like, in order to improve light-emitting efficiency.

The common electrode CE is formed on the organic light-emitting layer ORG. The common electrode CE and the pixel electrode PE are formed from, for example, a transparent conductive material such as indium tin oxide (ITO) or indium zinc oxide (IZO).

The sixth insulating film 16 is formed on the pixel electrode PE so as to partition the organic EL device OD into each and every pixel. That is, in the region where the sixth insulating film 16 is formed, the pixel electrode PE and the organic light-emitting layer ORG are not brought into contact with each other (insulated from each other). Therefore, even if voltage is applied between the pixel electrode PE and the common electrode CE, the organic light-emitting layer ORG does not emit light. In the example illustrated, each pixel comprises an organic light-emitting layer which emits blue, an organic light-emitting layer which emits green and an organic light-emitting layer which emits red. The organic EL device OD is sealed with the protective film 50, which protects the organic EL device OD from moisture and the like.

On the other hand, the second substrate SUB2 is formed from a glass or resin substrate, or an optical element such as an optical film or a polarizer. The second substrate SUB2 is disposed so as to oppose the first substrate SUB1. The first substrate SUB1 and the second substrate SUB2 are attached together with an adhesive 41.

In the example illustrated, the pixels comprise organic light-emitting layers ORG which emit different colors, respectively, but a common organic light-emitting layer ORG may be provided over a plurality of pixels PX. In such a structure, the second substrate SUB2 comprises a color filter in a region which covers at least the organic light-emitting layers ORG.

In this embodiment as well, an advantageous effect similar to that of the fourth embodiment can be obtained.

In each of the above-provided embodiments, the second portion SC12 corresponds to the semiconductor layer. The relay electrode RE corresponds to the metallic film or a first conductive layer. The pixel electrode PE corresponds to the pixel electrode or the second conductive layer. The source line S1 corresponds to a first wiring portion and the source line S2 corresponds to a second wiring portion.

In the first to third embodiments, the fifth insulating film 15 corresponds to the first inorganic insulating film. The fourth insulating film 14 corresponds to the organic insulating film located between the semiconductor layer and the first inorganic insulating film. The second insulating film 12 and the third insulating film 13 correspond to the second inorganic insulating film. The contact hole CH1 corresponds to the first opening. The side surface CH1A corresponds to the first side surface. The side surface CH1C corresponds to the fourth side surface. The contact hole CH2 corresponds to the second opening. The side surface CH2A corresponds to the second side surface. The contact hole CH3 corresponds to the third opening. The side surface CH3A corresponds to the third side surface.

In fourth embodiment, the fourth insulating film 14 corresponds to the organic insulating film. The second insulating film 12 and the third insulating film 13 correspond to the first inorganic insulating film located between the semiconductor layer and the organic insulating film. The fifth insulating film 15 corresponds to the second inorganic insulating film. The contact hole CH3 corresponds to the first opening. The side surface CH3A corresponds to the first side surface. The contact hole CH2 corresponds to the second opening. The side surface CH2A corresponds to the second side surface.

In the fifth embodiment, the fourth insulating film 14 corresponds to the organic insulating film. The second insulating film 12 and the third insulating film 13 correspond to the first inorganic insulating film located between the semiconductor layer and the organic insulating film. The contact hole CH3 corresponds to the first opening. The side surface CH3A corresponds to the first side surface. The contact hole CH2 corresponds to the second opening. The side surface CH2A corresponds to the second side surface.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   a first substrate comprising: a semiconductor layer; a first inorganic insulating film provided above the semiconductor layer and comprising a first opening in a region which overlaps the semiconductor layer; an organic insulating film provided above the semiconductor layer and comprising a second opening in a region which overlaps the first opening; a metal film stacked on the semiconductor layer on an inner side of the region where the second opening is formed; and a pixel electrode provided in the first opening and the second opening to be in contact with the metal film and the semiconductor layer, the metal film being spaced from a first side surface of the first opening and a second side surface of the second opening.

2. The display device of claim 1, further comprising:
a second inorganic insulating film provided between the semiconductor layer and the organic insulating film,
wherein
the organic insulating film is provided between the semiconductor layer and the first inorganic insulating film, and
the second inorganic insulating film comprises a third opening in a region which overlaps the first opening and the second opening.

3. The display device of claim 2, wherein
the metallic film is spaced from a third side surface of the third opening.

4. The display device of claim 3, wherein
the pixel electrode is in contact with the semiconductor layer between the third side surface and the metal film.

5. The display device of claim 2, wherein
the first inorganic insulating film covers the second side surface and is in contact with the second inorganic insulating film in the second opening.

6. The display device of claim 1, wherein
the first inorganic insulating film is provided between the semiconductor layer and the organic insulating film, and
the pixel electrode covers the second side surface and is in contact with the first inorganic insulating film in the second opening.

7. The display device of claim 6, wherein
the pixel electrode covers the first side surface and is in contact with the semiconductor layer between the first side surface and the metal film.

8. The display device of claim 1, wherein
at least one end portion of the metal film is in contact with a fourth side surface of the first opening.

9. The display device of claim 2, further comprising:
a first wiring portion and a second wiring portion disposed on the second inorganic insulating film and covered by the organic insulating film,
wherein
the first opening, the second opening and the third opening are located between the first wiring portion and the second wiring portion in plan view.

10. The display device of claim 6, further comprising:
a first wiring portion and a second wiring portion disposed on the first inorganic insulating film and covered by the organic insulating film,
wherein
the first opening and the second opening are located between the first wiring portion and the second wiring portion in plan view.

11. The display devices of claim 9, wherein
the first wiring portion and the second wiring portion are formed from a same material as that of the metal film.

12. The display device of claim 9, wherein
a width of the metal film is equal to or less than that of the first wiring portion and the second wiring portion.

13. The display device of claim 1, further comprising:
a second substrate opposing the first substrate; and
a liquid crystal layer between the first substrate and the second substrate.

14. A wiring substrate comprising:
a semiconductor layer;
a first inorganic insulating film provided above the semiconductor layer and comprising a first opening in a region which overlaps the semiconductor layer;
an organic insulating film provided above the semiconductor layer and comprising a second opening in a region which overlaps the first opening;
a first conductive layer stacked on the semiconductor layer on an inner side of the region where the second opening is formed; and
a second conductive layer formed in the first opening and the second opening to be in contact with the first conductive layer and the semiconductor layer,
the first conductive layer being spaced from a first side surface of the first opening and a second side surface of the second opening, and
the second conductive layer being in contact with the semiconductor layer between the first side surface and the first conductive layer.

15. The wiring substrate of claim 14, wherein
at least one end portion of the first conductive layer is in contact with a fourth side surface of the first opening.

* * * * *

UNITED STATES PATENT AND TRADEMARK OFFICE
CERTIFICATE OF CORRECTION

Page 1 of 1

PATENT NO. : 10,372,003 B2
APPLICATION NO. : 15/782930
DATED : August 6, 2019
INVENTOR(S) : Yasuhiro Kanaya It is certified that error appears in the above-identified patent and that said Letters Patent is hereby corrected as shown below:

On the Title Page

Item (54), the Title is incorrect. Item (54) should read:
-- (54) DISPLAY DEVICE AND WIRING SUBSTRATE --

Signed and Sealed this
Twenty-ninth Day of October, 2019

Andrei Iancu
*Director of the United States Patent and Trademark Office*